United States Patent
Renner et al.

(10) Patent No.: US 6,912,012 B2
(45) Date of Patent: Jun. 28, 2005

(54) VIDEO DECODER HAVING LOCK ALGORITHM THAT DISTINGUISHES BETWEEN A NOISY TELEVISION SIGNAL INPUT AND A VIDEO RECORDER SIGNAL

(75) Inventors: Karl Renner, Dallas, TX (US); Walter Demmer, Nuremberg (DE)

(73) Assignee: Texas Instruments Incorporated, Dallas, TX (US)

( * ) Notice: Subject to any disclaimer, the term of this patent is extended or adjusted under 35 U.S.C. 154(b) by 541 days.

(21) Appl. No.: 10/196,499

(22) Filed: Jul. 16, 2002

(65) Prior Publication Data

US 2003/0052997 A1 Mar. 20, 2003

Related U.S. Application Data

(60) Provisional application No. 60/307,199, filed on Jul. 20, 2001.

(51) Int. Cl.[7] .............................. H04N 5/04; H04N 5/05; H04N 9/44
(52) U.S. Cl. ........................ 348/536; 348/537; 348/533; 375/376; 327/147
(58) Field of Search ................................ 327/141, 147, 327/156; 348/536, 537, 505, 533, 500, 539, 527, 544, 607, 735; 375/373, 375, 376; 386/119, 48, 66, 71

(56) References Cited

U.S. PATENT DOCUMENTS

| | | | | |
|---|---|---|---|---|
| 5,506,627 A | * | 4/1996 | Ciardi ........................ 348/515 |
| 5,539,357 A | * | 7/1996 | Rumreich .................... 331/17 |
| 5,731,843 A | * | 3/1998 | Cappels, Sr. ................ 348/537 |
| 5,739,867 A | | 4/1998 | Eglit |
| 5,796,392 A | | 8/1998 | Eglit |
| 5,805,233 A | * | 9/1998 | West .......................... 348/537 |
| 5,953,071 A | | 9/1999 | Van Zon |
| 6,002,446 A | | 12/1999 | Eglit |
| 6,061,094 A | | 5/2000 | Maietta |
| 6,067,071 A | | 5/2000 | Kotha et al. |
| 6,317,161 B1 | * | 11/2001 | Renner et al. .............. 348/536 |
| 6,330,034 B1 | * | 12/2001 | Renner et al. .............. 348/536 |
| 6,452,592 B2 | * | 9/2002 | Zhang et al. ............... 345/213 |
| 6,522,365 B1 | * | 2/2003 | Levantovsky et al. ...... 348/537 |
| 6,532,042 B1 | * | 3/2003 | Kim ........................... 348/537 |
| 6,839,092 B2 | * | 1/2005 | Renner ....................... 348/505 |

OTHER PUBLICATIONS

"Television Engineering Handbook," K. Blair Benson & Jerry C. Whitaker, McGraw–Hill Inc., pp. 13.163–13.166.
"Synchronization Issues for Consumer TV," Kees Van Zon, Proceedings 1995, IEEE International Symposium on Synchronization, Dec. 14–15, 1995, pp. 165–170.
Renner, Karl, "Video Decoder Having Lock Algorithm That Distinguishes Between A Noisy Television Signal Input And A Video Recorder Signal," pp. 1–24, U.S. Appl. No. 10/196, 499, TI–32264.

* cited by examiner

*Primary Examiner*—John Miller
*Assistant Examiner*—Jean W. Désir
(74) *Attorney, Agent, or Firm*—W. James Brady, III; Frederick J. Telecky, Jr.

(57) ABSTRACT

A phase-locked loop is provided which is operable to lock the sampling clock (pixel clock) to the incoming horizontal sync pulse contained within composite video information. Given the input signal is a VCR signal or a normal noise-free signal, there exists two modes of operation, coarse lock mode and fine lock mode, which are used in controlling the phase-locked loop. In the coarse lock mode, coarse corrections are made to a horizontal discrete time oscillator so that a fast lock may be achieve using the fine lock mode. Coarse corrections are based on a normalized sum of weighted pixels collected within a narrow gate window. Lock is achieved when the falling edge is centered within the window. Given the input signal is a television signal having noise, there exists one mode of operation where the flat window phase detector is used instead of coarse lock mode to bring the sync edge to fall within the window, where the flat window normalization constant is tuned.

10 Claims, 9 Drawing Sheets

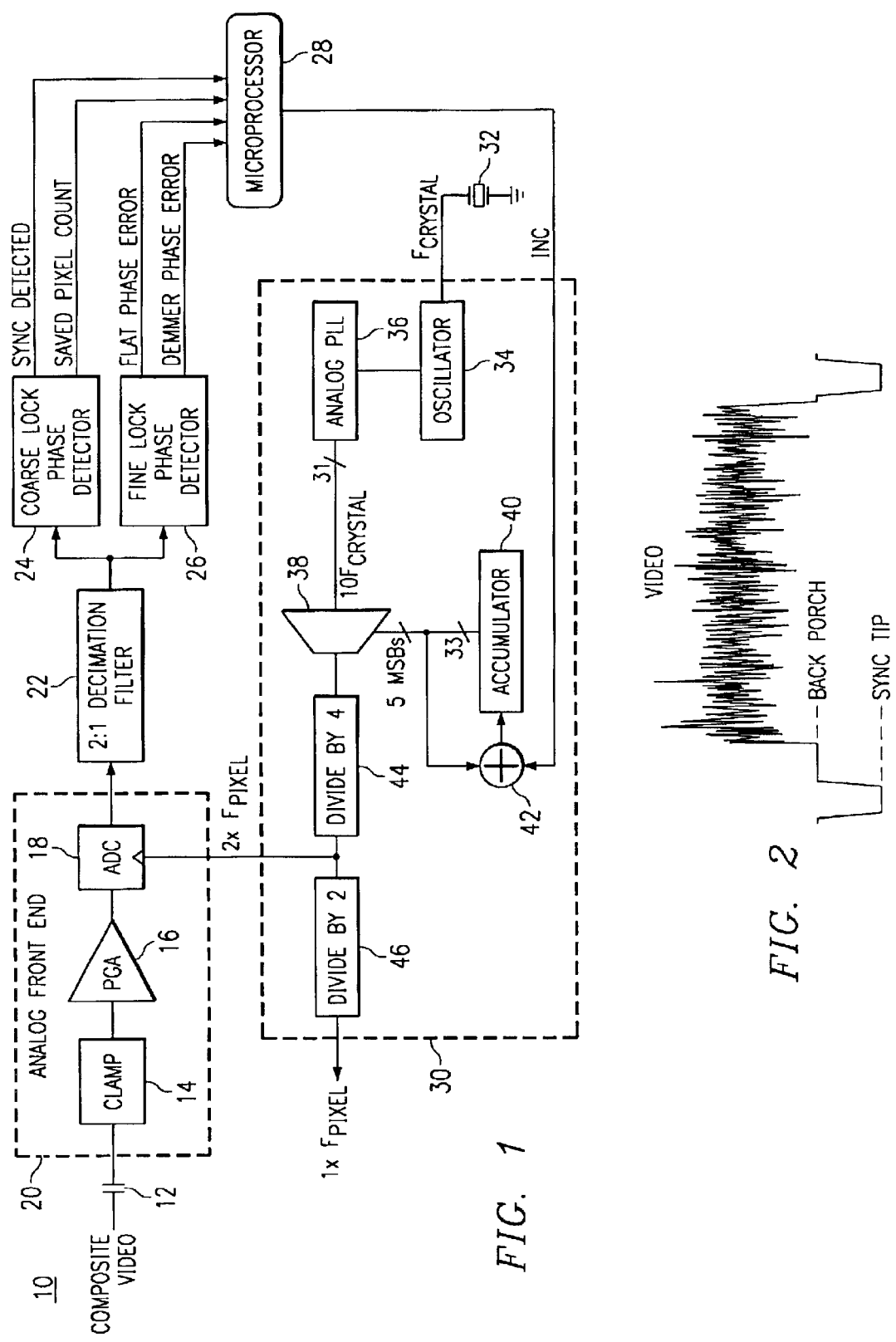

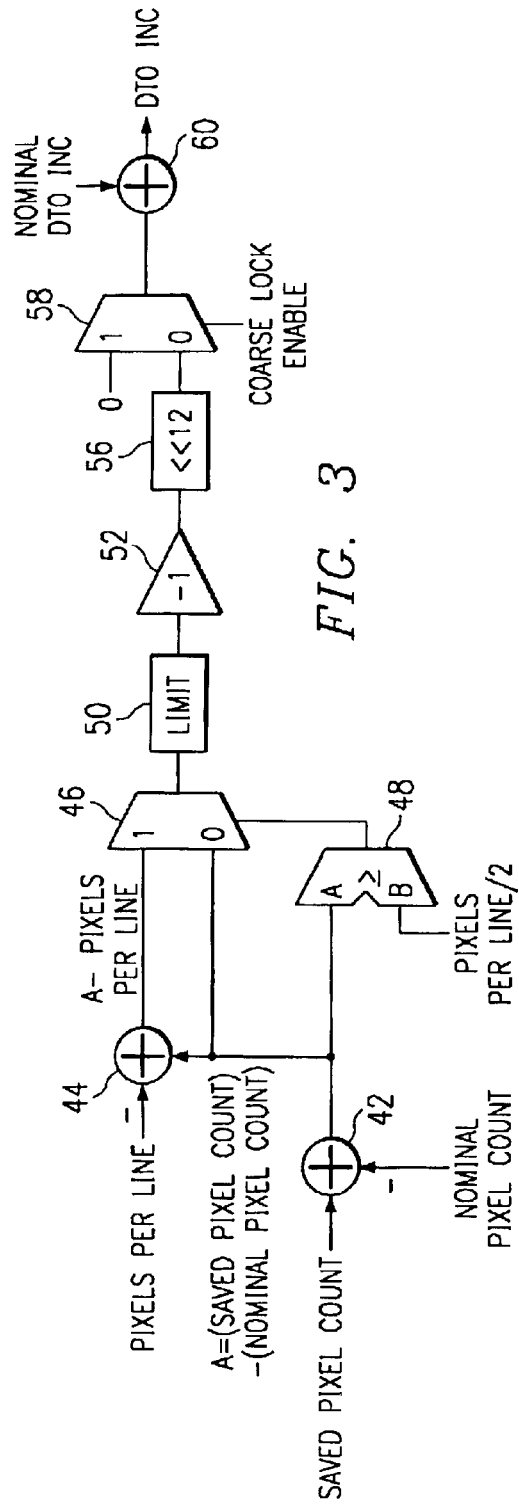
FIG. 3
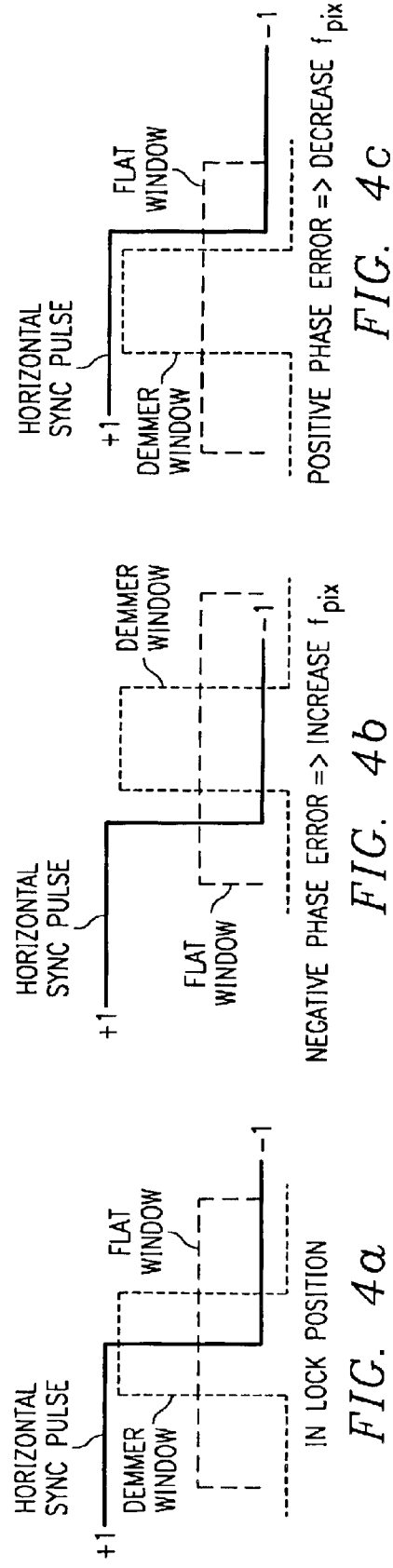
FIG. 4a
FIG. 4b
FIG. 4c

VIDEO DECODER HAVING LOCK ALGORITHM THAT DISTINGUISHES BETWEEN A NOISY TELEVISION SIGNAL INPUT AND A VIDEO RECORDER SIGNAL

CROSS-REFERENCE TO RELATED APPLICATION

This application claims priority under 35 U.S.C. § 119(e)(1) of provisional application Ser. No.60/307,199, filed Jul. 20, 2001.

The present invention relates to a copending application entitled "Horizontal Phase-Locked Loop For Video Decoder," Ser. No. 09/126,630, filed on Jul. 30, 1998, which is incorporated by reference herein.

FIELD OF THE INVENTION

The present invention relates to video decoders, and, more particularly, to a digital video decoder having a lock process for noisy television signal inputs.

BACKGROUND OF THE INVENTION

Since the advent of television, good horizontal line synchronization characteristics have been a most crucial performance parameter of television (TV) receivers and video decoders. A key parameter of the performance of a video decoder is determined by its synchronization properties. Even under worst case circumstances, an output image generated by the video decoder must be horizontally and vertically aligned with the original image as captured by the signal source. Thus, elaborate horizontal synchronization schemes and systems have evolved, aiming to achieve robust synchronization particularly in the presence of noise—a noisy signal condition. This condition occurs due to the weak amplitude of the RF signal input to the TV tuner.

With the market introduction of helical scan video recorders, such as VHS and Beta, a new class of synchronization requirements arose, where the time base stability, both horizontal and vertical scanning, may be impaired by timing fluctuations. The demand for good noisy signal performance requires a slow reaction, i.e. a long time constant combined with minimal damping of the synchronization phase locked loop (PLL); while, time base instabilities of video recorders, on the other hand, require fast action, i.e. a short time constant combined with strong damping. Thus, both scenarios are contradictory as they require opposing synchronization strategies for optimum results. Consequently, non-adaptive implementations of the synchronization functions suffer insufficient performance for either of the two worst case scenarios.

In order not to compromise performance, most TV receivers deal with this problem by means of two distinctly different sets of characteristics of their horizontal phase locked loop (PLL) as is disclosed in "Television Engineering Handbook," K. Blair Benson & Jerry C. Whitaker, McGraw-Hill Inc., pp. 13.163–13.166, which is incorporated by reference herein. As is described, for various operating conditions, a choice of parameters proves to be nearly optimum: noisy-signal performance, natural frequency, $f_{nn}$= 500 Hz, damping factor, K~1; video-cassette recorder operation, $f_{nn}$=1000 Hz, K~18.

Often the viewer has to choose the appropriate mode whether television or VCR which leaves room for misinterpretation. Several attempts, however, have been made for automatic identification and adaptation of the appropriate mode as is also disclosed in "Television Engineering Handbook," K. Blair Benson & Jerry C. Whitaker, McGraw-Hill Inc., chapter 13.14.3. In U.S. Pat. No. 5,953,071, (col. 2 line. 11–33), which is incorporated by reference herein, its objective is to automatically adapt to the characteristics of a particular signal source and more particularly to auto-adaptively change the bandwidth of the loop filter.

Generally, these aforementioned approaches use a noise estimate measurement to control the loop gain of the horizontal synchronization PLL to approximate an optimum match of the PLL characteristics. Other approaches, such as, coincidence detection, dual-loop PLL usage, adaptive loop control, and behavioral enhancement during the vertical blanking interval, are disclosed in "Synchronization Issues for Consumer TV," Kees van Zon, Proceedings 1995, IEEE International Symposium on Synchronization, Dec. 14–15, 1995 pp.165–170, which is incorporated by reference herein.

There, however, exists a need for a video decoder having the capability of distinguishing between a television and VCR signal and, furthermore, distinguishing between a noisy signal and normal signal; and thereby, applying the appropriate optimum signal processing technique to the signal.

SUMMARY OF THE INVENTION

To address the above-discussed deficiencies of predrivers, the present invention teaches a video decoder having the capability of selecting the proper mode of operation whether television or video cassette recorder (VCR). In addition the video decoder of the present invention is a method which improves noisy signal synchronization properties by means of automatic selection and tuning of two different phase detectors.

A phase-locked loop is provided which is operable to lock the sampling clock (pixel clock) to the incoming horizontal sync pulse contained within composite video information. Given the input signal is a VCR signal or a normal noise-free signal, there exists two modes of operation, coarse lock mode and fine lock mode, which are used in controlling the phase-locked loop. In the coarse lock mode, coarse corrections are made to a horizontal discrete time oscillator so that a fast lock may be achieve using the fine lock mode. In fine lock mode, fine corrections are based on a normalized sum of weighted pixels collected within a narrow gate window. Lock is achieved when the falling edge is centered within the window. Given the input signal is a television signal superimposed by noise, there exists a noisy signal mode of operation where the flat window phase detector is used instead of coarse lock mode to bring the sync edge to fall within the window, where the normalization constant is tuned.

Advantages of this design include but are not limited to a video decoder having a method of operation that distinguishes between a television and video recorder modes of operation, wherein the difference of the horizontal phase error of the top and bottom halves of the picture are made. A phase detector window being insensitive to offset variations, such as a demmer window, is used which is not sensitive to the video DC levels which are a function of sync tip and the back porch levels of the synchronization pulse. The demmer window applies a unique set of weighting coefficients to pixels that fall within the fine lock window. If lock is lost, the video decoder switches to the use of the flat window phase detector to regain lock. This video decoder incorporates the use of a bisection technique for tuning the flat window normalization constant.

BRIEF DESCRIPTION OF THE DRAWINGS

For a more complete understanding of the present invention and the advantages thereof, reference is now made to the following description taken in conjunction with the accompanying drawing in which like reference numbers indicate like features and wherein:

FIG. 1 illustrates a block diagram of the system incorporating the invention's phase-locked loop.

FIG. 2 is a diagram of a video input signal containing a horizontal synchronization pulse.

FIG. 3 illustrates a block diagram demonstrating the logic behind the coarse phase lock processing performed by the coarse phase detector of FIG. 1.

FIGS. 4a, 4b and 4c illustrate three graphs showing a demmer window, and a flat window relative to a horizontal sync pulse, where the respective graphs are shown in locked position, with negative phase error (indicating the necessity for an increase in $f_{pix}$) and with positive phase error (indicating the necessity for a decrease in $f_{pix}$).

DETAILED DESCRIPTION OF THE PREFERRED EMBODIMENTS

Figure 5:
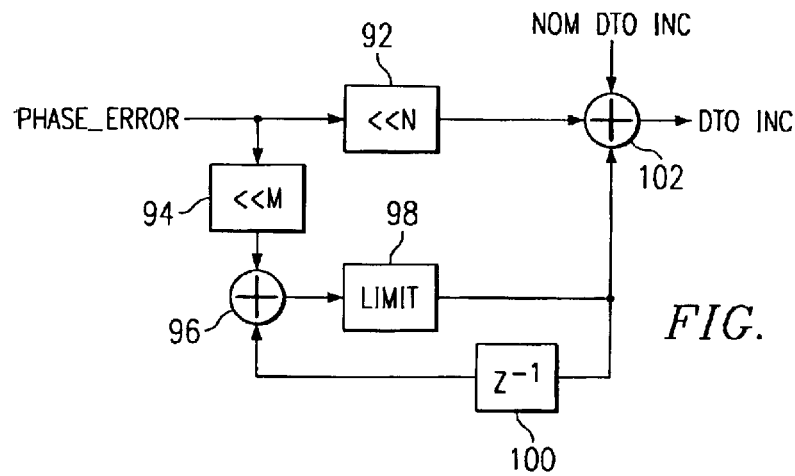
FIG. 5 is a logic diagram which illustrates the processing for the fine phase lock.

The invention provides a system which locks the phase of the pixel clock pulse to the phase of the horizontal sync pulse. In a preferred embodiment, the invention is implemented on a digital integrated circuit as part of a mixed signal video decoder multi-chip module. FIG. 1 illustrates a block diagram of the system incorporating the invention's phase-locked loop. On a video line by video line basis, microprocessor 2 reads parameters from the coarse and fine lock phase detectors which represent a phase error signal based on the position of the horizontal sync pulse relative to the locked position.

FIG. 1 illustrates a block diagram of the system incorporating the invention's phase-locked loop. In operation, a composite video signal is input through a capacitor 12 connected to an analog front end 20 including a clamp 14, a programmable gain amplifier (PGA) 16, and an analog-to-digital converter (ADC) 18. In order to restore the DC bias voltage, clamp 14 clamps the sync tip of the input signal to a reference voltage. PGA 16 amplifies and offsets the signal which is then fed to ADC 18 which outputs 10 bit pixels. The gain and offset are adjusted in order to produce a desired target sync height and back porch level at the ADC output. ADC 18 runs at twice the pixel clock frequency $2 \times f_{pixel}$. A decimation filter 22 decimates the data rate by 2 to 1 to $1 \times f_{pixel}$. The output of decimation filter 22 is fed to the coarse lock and fine lock phase detectors, 24 and 26, respectively. A microprocessor 28 reads parameters from coarse lock phase detector 24 which indicate detection of the horizontal sync pulse falling edge and the pixel count at which the pulse edge was detected. Parameters from fine lock phase detector 26 represent phase error produced from demmer and flat window. These parameters are processed by microprocessor 28. Microprocessor 28 generates an increment value, inc, which is written to a horizontal discrete time oscillator (DTO) 30 which runs at $$\frac{310 f_{crystal}}{\left(\frac{inc}{2^{27}} - 1\right)}.$$

Increment value, inc, is sent through summer 42 to increment accumulator 40. A crystal oscillator 32 inputs a reference frequency, $f_{crystal}$, to an analog phase lock loop 36 which multiplies it by a factor of 10. Thirty-one different phases of this frequency are input to a multiplexer 38 whose output is controlled by the five most significant bits (MSBs) of accumulator 40. The output of multiplexer 38 represents a synthesized frequency which is divided down by a frequency dividers, 44 and 46, to produce the 2× and 1× pixel clock frequencies. The 2× pixel frequency drives ADC 18 of analog front end 20.

FIG. 2 represents a television signal having a horizontal synchronization pulse prior to video data as shown. This signal is a complex signal containing all the information needed for reconstructing and displaying the sequence of rectangular color images which it represents. The color burst information is sent along succeeding the horizontal synchronization pulse for regeneration of the sub-carrier which is needed for demodulation of the chrominance signal. For simplicity, the color burst is not shown in the data signal in FIG. 2. The horizontal phase lock loop (PLL) in a video decoder as shown in FIG. 1 locks to the falling edge of the horizontal synchronization pulse in the video input. The pixel clock frequency of DTO 6 is adjusted to center the falling edge of synchronization pulse within a gate window that is 15 pixel clocks wide.

FIG. 3 illustrates a block diagram demonstrating the logic behind the coarse phase lock processing performed by coarse phase detector 30 and the microprocessor 2 of FIG. 1. Adder 42 adds the saved pixel count to a negated nominal pixel count. Adder 44 adds the output of adder 42, which is equal to variable A (saved pixel count minus the nominal pixel count), to a negated number of pixels per line expected per the system chosen. Multiplexer 46 selects the output adder 42 or rather variable A or it selects the output of adder 44 which represents variable A minus the pixels per line. Comparator 48 controls this selection on the basis of whether variable A is greater than variable B which represents the number of pixels per line divided by 2. If variable A is greater than or equal to variable B then multiplexer 46 selects the input labeled (A-pixels per line) otherwise multiplexer 46 selects the input of variable A. Multiplexer selections of variable A minus pixels per line and variable A, which represent delta correction numbers, are limited by limit block 50 to a value of ±40 so that the coarse correction to the horizontal DTO frequency does not stress the hardware. This limited delta correction is negated by inverter 52. The result is left shifted by shift register 56 by a predetermined number of bits to produce a value that is added to the nominal DTO increment. For example, for the embodiment shown in FIG. 3, the result is shifted by 12 bits. If no sync pulse is detected, the coarse lock enable bit which is read by the microprocessor and controls multiplexer 58 is logic one and multiplexer 58 selects 0 as the input number to which the nominal DTO increment (INC) is added by adder 60 to serve as the DTO increment which is written by microprocessor 2 of FIG. 1 to increment block 12 of DTO 6 of FIG. 1. Therefore, the nominal DTO increment value as described in equation by the following equation:

$$INC = 2^{27}\left(\frac{31}{8} * 10 * \frac{f_c}{f_{pix}} + 1\right) \quad [1]$$

is written to DTO 6. If a sync pulse is detected, then the coarse lock enable bit to multiplexer 58 is logic zero and the processed saved pixel count from shift register 56 is selected by multiplexer 58 and added by adder 60 to the nominal DTO increment (INC). The sum from adder 60 is written by microprocessor 2 to increment block 12 of DTO 6 and this serves as the DTO coarse adjustment increment.

FIGS. 4a, 4b and 4c illustrate three graphs showing a demmer window (the distribution within the window resembles a demmer weight distribution), and a flat window (the weight distribution with in the window is rectangular) relative to a horizontal sync pulse, where the respective graphs are shown in locked position, with negative phase error (indicating the necessity for an increase in $f_{pix}$) and with positive phase error (indicating the necessity for a decrease in $f_{pix}$) The sync pulse is normalized to fall between values of +1 and −1. Assuming multiplication by the windows of pixel information corresponding to the horizontal sync pulse, the flat window applies an equal weighting to the pixels while the demmer applies a positive weight to points near the center of the window and a negative weight to those near the outside. The windows are enabled by the decode of pixel counter 24 which is clocked by pixel clock PCK of FIG. 1. If the sync edge falls to the left of the window, as shown in the FIG. 4b, then the pixel clock frequency must be increased in order to center the window on the sync edge to lock position as is shown in FIG. 4a. If the sync edge falls to the right, as shown in FIG. 4c, then the pixel clock frequency must be decreased to achieve lock.

FIG. 5 is a logic diagram which illustrates the processing for the fine phase lock. The phase error is left shifted n bits, where n is an integer, by shift register 92. The phase detector window selected determines n. The phase error is also shifted left m bits by shift register 94 (m being an integer) and then accumulated, by summing the result with summer 96, using a line delayed feed back loop which limits the summed result between positive and negative limits (so that overflow does not occur) by virtue of limit block 98 and delay line block 100. The shift constants m and n are chosen to achieve desired phase-locked loop time constants and damping factors for TV (television) and VCR (video cassette recorder) modes of operation. These shift constants can easily be changed in software. The output from block 100 represents an accumulated offset characterized as a constant frequency error in the horizontal sync frequency that may occur in non-standard video. Summer 102 adds this accumulated offset with the output of shift register 92 and the nominal DTO increment (nom DTO INC) to produce an actual DTO increment (DTO INC) which is written to increment block 12 of FIG. 1.

Figure 6:
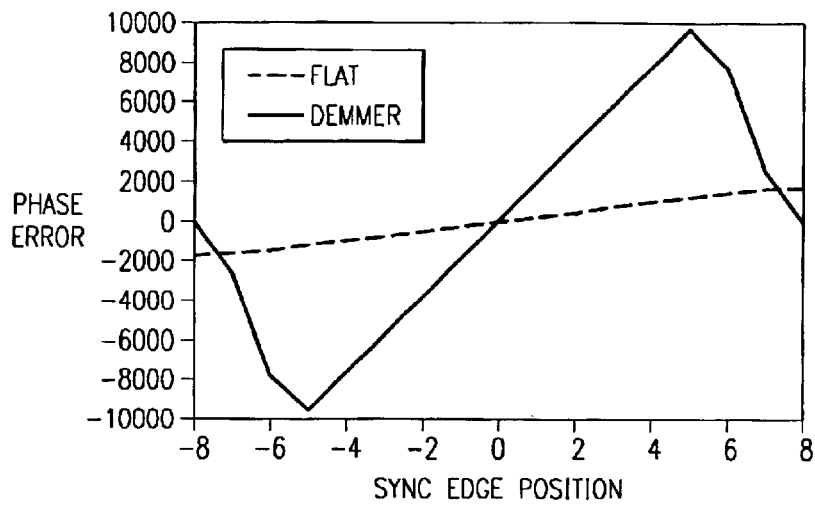
FIG. 6 is a graph illustrating phase error versus sync falling edge position for the demmer and flat windows.

FIG. 6 is a graph illustrating phase error versus sync falling edge position for the demmer and flat windows. As shown, the flat window has one zero crossing while the demmer window has three. Thus the demmer window requires coarse lock to bring the edge to within its effective range. When noise is present in the video input signal, the signal becomes clipped when it falls below the 0 pixel value at the output of ADC 26. This results in an elevation of the sync tip level. Lock to a noisy video input signal using the flat window requires a decrease in the normalization constant. The demmer window, however, does not require any adjustment because its normalization constant is zero. Yet, the demmer window does require the use of coarse lock to position the sync edge. When noise is present, however, coarse lock cannot be used.

The width of the flat and demmer windows measure 15 pixels wide ±7pixels each from the center of the window at 0. The effective width of the demmer window is narrower than the flat window (±5pixels) and it has a higher gain within 5 pixels of the center window position. The flat window has a constant gain over the entire 15 pixel width. The demmer window is the default window used in both TV and VCR modes of operation. Flat window is used by the coarse/fine lock decision process and by the noisy signal process of operation in place of coarse lock.

Figure 7:
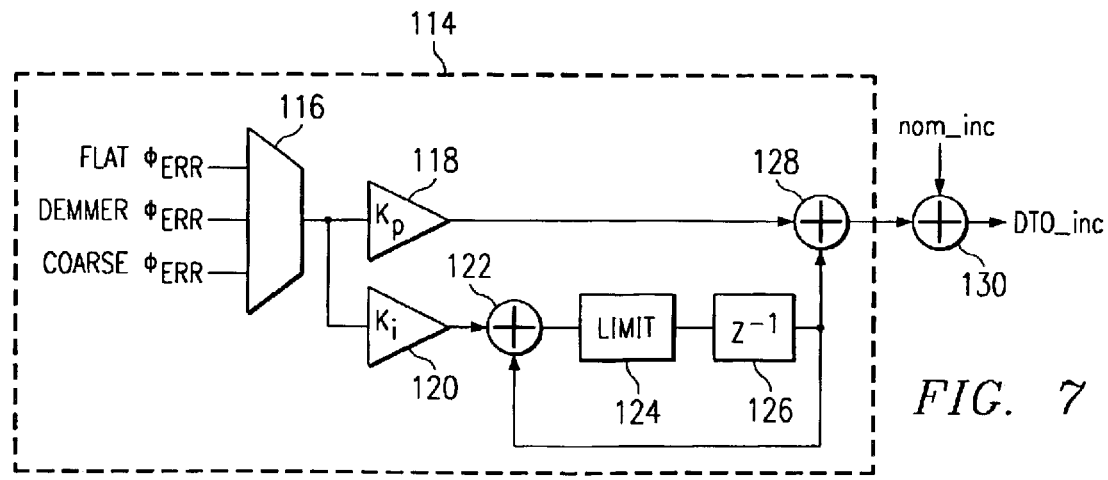
FIG. 7 is a block/logic diagram showing the architecture for the horizontal discrete time oscillator control circuitry of the phase locked loop of FIG. 1.

FIG. 7 illustrates horizontal DTO control signal processing which is implemented in software on microprocessor 2. Operation of the signal processing of FIG. 7 will now be made with reference to hardware in FIG. 1. On a line-by-line basis, microprocessor 2 reads the flat, demmer, and coarse phase error from coarse and fine phase detectors, 30 and 32. Multiplexer 116 enables one of these applied phase error signals while disabling the others. A proportional gain $K_p$ of amplifier 118 and an integral gain $K_i$ of amplifier 120 are applied to the selected phase error. Frequency delay element 126 accumulates values that compensate for frequency error, making PLL 22 a second order phase locked loop. While a fractional portion of the phase error is accumulated through delay element 126, the limit filter block 124 which defines the upper and lower bounds for delay element 126 determines whether the phase error falls within these predetermined limits. If the fractional portion of the phase error does not fall within the predetermined limits, the value of the upper and lower bound of the limit filter block 124 is selected. Thus, a value which compensates for the frequency error in the video input signal is accumulated. The results are added to a nominal DTO increment (nom_inc) to produce a result which is written to DTO 6 to lock and maintain lock to an incoming synchronization frequency.

The coarse phase detector 30 is used to make coarse corrections to the DTO 6 frequency or what is conventional known as achieving coarse lock. demmer and flat window are used for fine corrections or fine lock. The coarse lock phase error, coarse $\Phi_{err}$, is the difference between the saved pixel count when synchronization is detected and the expected pixel count when lock is achieved. Coarse lock detects the synchronization pulse edge when the pixels fall below a threshold for a minimum period of time. The fine lock phase error is the accumulation of weighted pixels within a 15 pixel clock wide window. The flat window weighting coefficients are equal while the demmer coefficients are different. A normalization constant must be applied to the flat window which is a function of the sync tip and back porch pixel values. Phase error is calculated in the coarse and fine phase detectors using the following equation:

$$\Phi_{err} = (\Sigma \text{coefficient}_i * \text{pixel}_i) - \text{normalization constant } i=0 \ldots 14$$

| Phase Detector | Coefficients | | | | | | | | | | | | | | |
|---|---|---|---|---|---|---|---|---|---|---|---|---|---|---|---|
| flat window | 1 | 1 | 1 | 1 | 1 | 1 | 1 | 1 | 1 | 1 | 1 | 1 | 1 | 1 | 1 |
| demmer window | −176 | −176 | 64 | 64 | 64 | 64 | 64 | 64 | 64 | 64 | 64 | 64 | 64 | −176 | −176 |

| | Normalization constant |
|---|---|
| flat window | 15 * [512 − (tip + porch)/2] = 5820 |
| demmer window | 0 |

A phase error $\Phi_{err}$ of zero corresponds to the lock position where the sync edge is centered within the window. If not centered then the PLL 22 adjusts the DTO pixel clock frequency such that the phase error $\Phi_{err}$ goes to zero. The flat window is sensitive to sync tip and back porch levels because of its normalization constant. The demmer window, however, is not.

Figure 8:
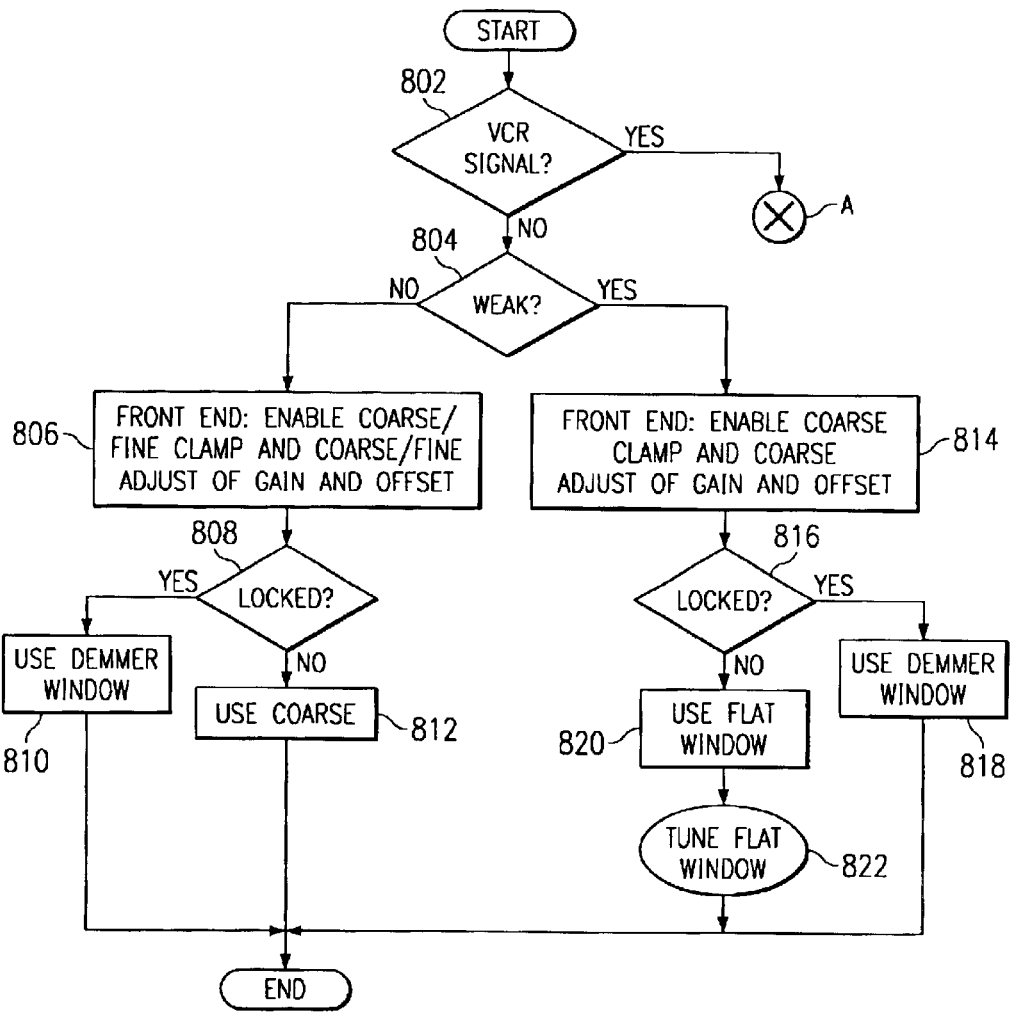
FIG. 8 is the flow chart showing the steps of the processing a noisy signal using the novel process of the present invention.

FIG. 8 displays the flowchart for the noisy signal algorithm which may be implemented in software on microprocessor 2. In step 802, microprocessor 2 distinguishes between television mode of operation and VCR mode of operation. Within this step, the difference between the top half frame phase error and the bottom half frame phase error is calculated. In VCRs, head switching exists which means that during the vertical blanking interval there's a substantial change in the horizontal synchronization pulse position. This merely indicates that phase lock loop 22 sees a substantial perturbation in the horizontal synchronization. As a result, lock must be regained. Thus, if there is a predetermined difference between the top half frame phase error and the bottom half frame phase error, there may be some indication that a VCR signal is present. Without this determination, a video decoder may accidentally process the noisy signal algorithm during the presence of a VCR signal, which will ruin the horizontal sync operation. Therefore, it is imperative that a VCR signal be distinguished from a standard television signal.

Furthermore, given step 804, it is essential to distinguish between a normal and a noisy signal. If the signal is normal, proceed to step 806 where the analog front end enables both the coarse and fine clamps to clamp the signal to the reference voltage and coarse or fine adjustment of gain and offset to make the analog video signal to fall within the ADC 26 input range. Thus, coarse or fine lock is used to achieve lock. Decision block 808 determines whether the signal is locked, if not as indicated by step 90 microprocessor 2 uses coarse lock. If the signal is locked, in step 810, the demmer window is enabled. If the signal is noisy, as indicated in step 814, only coarse clamp is enabled to clamp the signal to the reference voltage and coarse adjustment of gain and offset to make the analog signal to fall within the ADC input range. Only the coarse clamp would be enabled since the sync tip edge is hard to distinguish. Thereby, it is best to enlarge the signal in order to achieve fine lock which is done by the coarse adjustment mode.

The noisy signal algorithm uses the demmer window for its default phase detector. This noisy signal algorithm runs on a frame by frame basis and reacts slowly to noisy signal inputs. Once the signal is locked, as shown in steps 816 and 818, coarse lock is disabled and fine lock is enabled. If lock is lost, then according to steps 820 and 822 flat window is selected and its normalization constant is tuned or adjusted until lock is achieved. Afterwards, as indicated in steps 816 and 818, the demmer window is selected.

Figure 9:
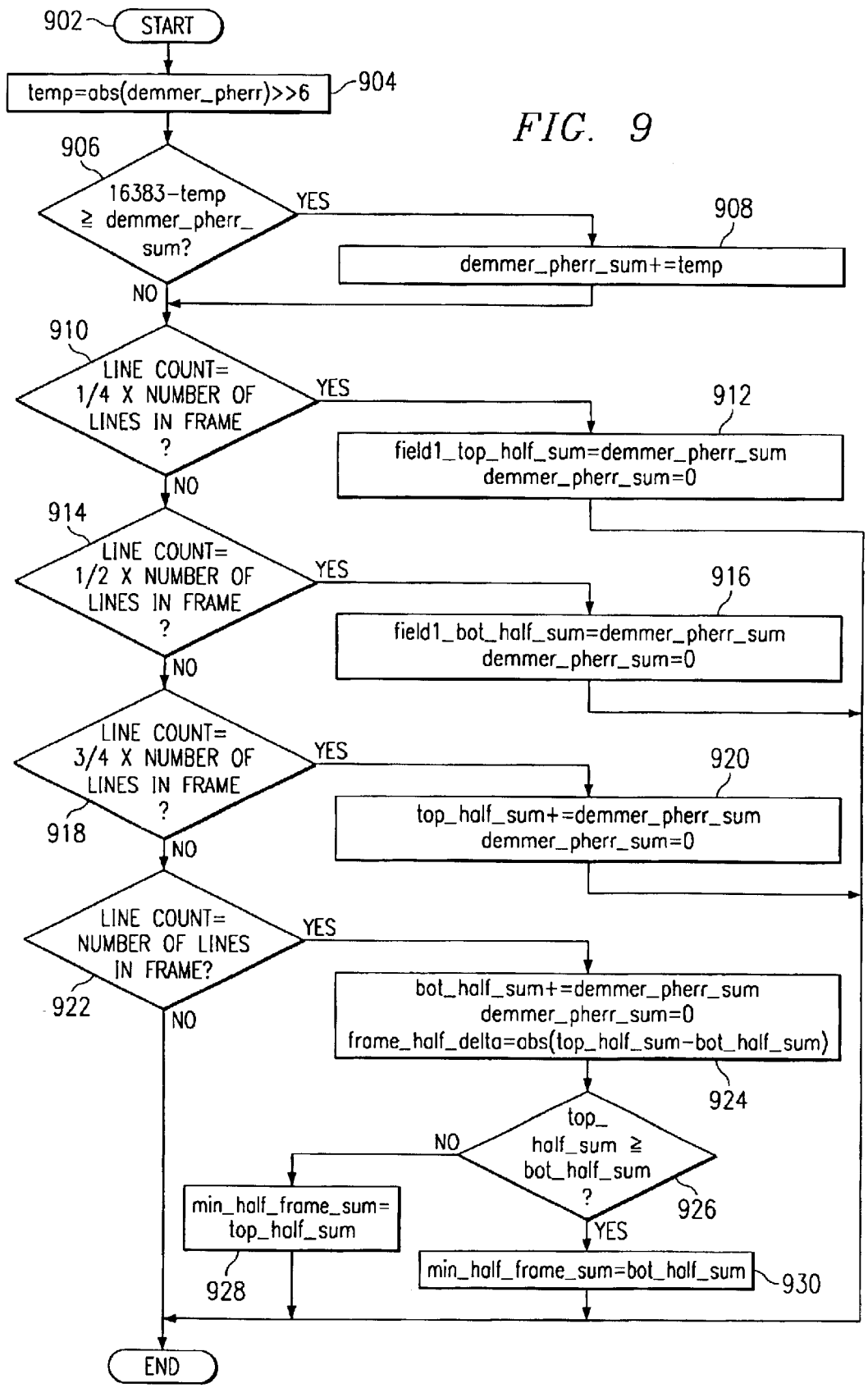
FIG. 9 illustrates the flow chart showing the steps of the calculating the top and bottom half frame sums of phase error.

FIG. 9 shows the flowchart for the processing the signal if is determined to be a VCR signal as indicated in FIG. 8 at node A. Initially, in step 904, the absolute value of the demmer window phase error is right shifted six bits and stored into a temporary variable. In step 906, the temporary variable is subtracted from 16383 and compared with the demmer window phase error sum. The objective is to sum the absolute value of the demmer window phase window over half a field and execute the shifting instruction to avoid overflow problems. If it is greater than or equal to the demmer window phase error sum, than as indicated in step 908, the demmer phase error sum is increased by the temporary variable. Variables are used that calculated the half frame sum of the phase error and the difference between the top and bottom halves. A frame consists of two fields which are interlaced together. The parameter, vert_count, keeps track of the line count. The fields are broken into halves whose boundaries are set at ¼, ½, ¾, and 1 times the lines per frame to determine whether the pointer is located in the top half or the bottom half of the field. The objective is to accumulate the sums of that correspond to the top half and the bottom half of each field. Thus, in steps 910, 914, 918 and 922 respectively, the line count is compared to ¼, ½, ¾, and 1 times the total number of lines per frame. Depending upon which field the line is from, the sum of the top half of the frame or the bottom half of the frame is set equal to the demmer phase error $\Phi_{err}$ sum and the demmer phase error $\Phi_{err}$ sum is reset to zero, accordingly as shown in steps 912, 916, 920, and 924. The cumulative effect is that the top half of field 1 is combined with the top half of field 2 to generate the top half frame sum. Likewise, the bottom halves of field 1 and field 2 are combined to produce the bottom half frame sum. Furthermore, in step 924, the bottom half sum is updated with the demmer phase error sum and the absolute value of the difference between the top and bottom half sum is calculated set equal to a parameter which defines the frame half delta. During a VCR signal, there is a head switch during the vertical blanking interval which throws the video decoder out of fine lock where the video decoder must go into coarse mode to correct itself.

Accordingly, the difference between the top and the bottom half sum phase error is substantial because the top half will still be in need of regaining fine lock and as a result there is a large skew in the phase error. Yet, with the bottom half, fine lock will be achieved readily. Thus, the difference between the top and the bottom halves will be quite substantial. As a result, the frame half delta is used in the following process to distinguish between whether the input signal is a VCR signal or a television signal. If the frame half delta is substantial, this will be indicative of the presence of a VCR signal. In step 926, the top and bottom halves are compared, where the least of the two is set to the variable which indicates the minimum half frame sum as is illustrated in steps 928 and 930.

Figure 10:
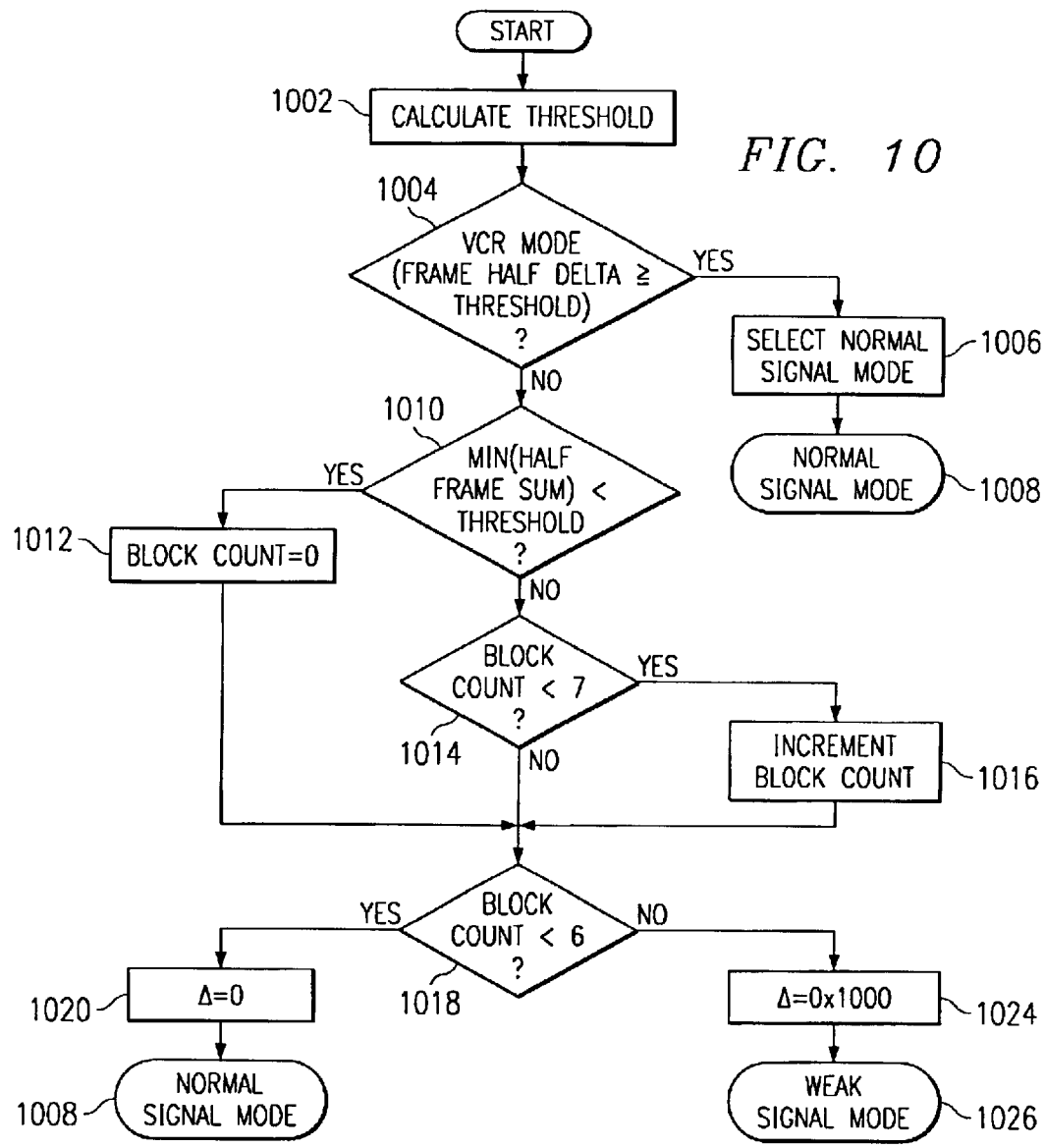
FIG. 10 illustrates a flow chart showing the steps of processing a normal and noisy signal.

FIG. 10 illustrates the decision logic for selecting normal signal and noisy signal modes which is step 804 of FIG. 8 given the signal is a television signal or a VCR signal. In step 1002, a threshold is first computed based upon the minimum half frame sum which is used to determine if the input is a television or VCR signal. The threshold is generated from characterization data taken using TV and VCR inputs. The threshold serves as a measure of the amount of noise present.

As explained above, when a VCR signal is present head switching exists during the vertical blanking interval which throws the video decoder out of fine lock due to a shift in the sync pulse position. This necessitates that the video decoder switch into coarse mode to correct itself. Accordingly, the difference between the top and the bottom half sum phase error is substantial because the top half will still be in need of regaining fine lock and, as a result, there is a large skew in the phase error for the top half. The bottom half, however, will achieve fine lock readily. Thereby, the difference between the top and the bottom halves will be quite substantial. As a result, the frame half delta is used in the process shown in FIG. 10 to distinguish between whether the input signal is a VCR signal or a television signal. If the frame half delta is substantial, this will be indicative of the presence of a VCR signal. Accordingly, in step 1004, the frame half delta is compared with the threshold derived in step 1002. If the frame half delta is greater than or equal to the threshold, a VCR signal is present and steps 1006 and 1008 are executed, wherein the block count is set to zero, the hysteresis delta, $\Delta$, is reset to zero and normal signal mode is selected.

If the frame half delta is less than the threshold, then the input is TV signal. In step 1010, it is determined whether the minimum half frame sum of the phase error is less than the hexadecimal constant value 0x2a00 minus a delta which provides hysteresis. If it is, this is indicative a signal without noise or a normal signal and thereby, in step 1012 the block count is reset to zero. Block count indicates the number of consecutive frames. If there is a signal with a large amount of noise, then the minimum half frame sum will be large due to the noise making the phase lock loop jitter substantially. Thus if there is noise, step 1014 determines whether the block count is less than seven. If it is, then the block count is incremented in step 1016. If it is not, then in logical block 1018 it is determined whether the block count is less than 6. If it is, as shown in step 1020, the hysteresis delta ($\Delta$) parameter is reset to zero and, in step 1008, the normal signal mode is selected. If the block count is equal to or greater then 6, which indicates that this condition is met for 6 or more consecutive frames, then the hysteresis delta ($\Delta$) parameter is set to hexadecimal 0x1000 and the noisy signal mode is entered in step 1026. The primary purpose of the hysteresis delta ($\Delta$) parameter is to introduce hysteresis into the selection so that oscillation between the two modes of normal and noisy signal mode does not occur.

Figure 11:
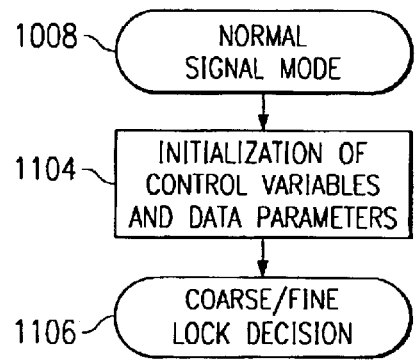
FIG. 11 illustrates a flow chart showing the steps of processing in normal signal mode continued from FIG. 10.
Figure 12:
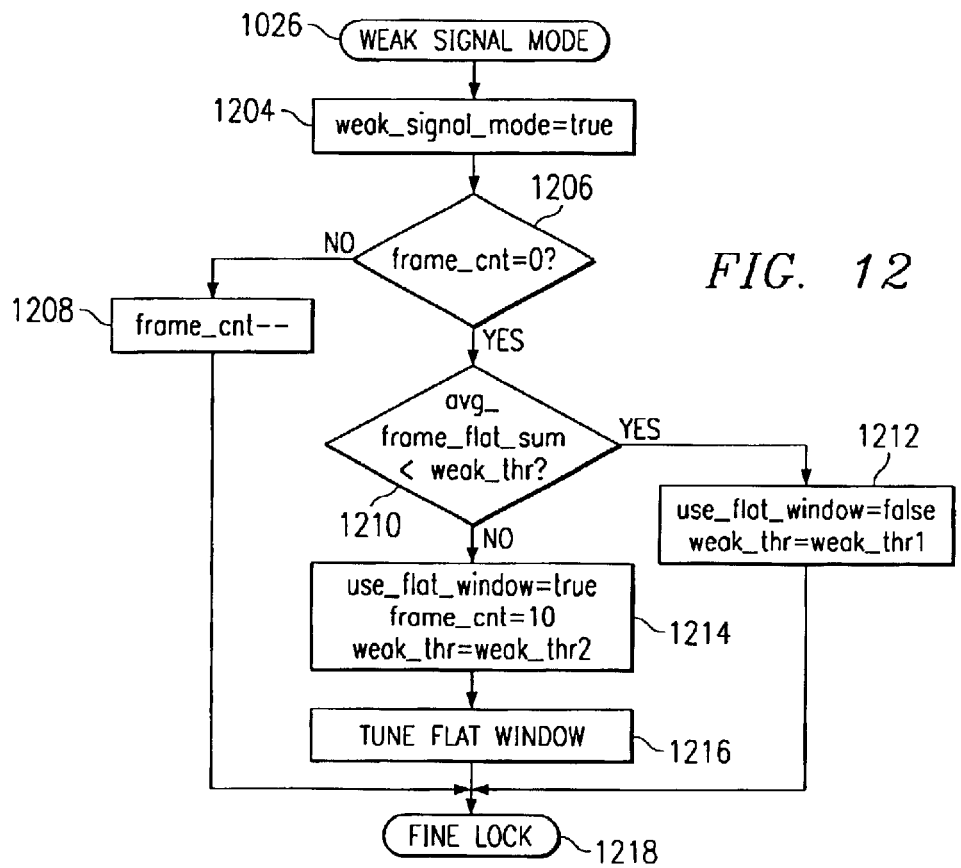
FIG. 12 illustrates a flow chart showing the steps of processing in noisy signal mode continued from FIG. 10.

FIGS. 11 and 12 illustrate normal and noisy signal modes of operation, respectively. In the normal mode of operation, the control variables and data parameters are initialized in step 1104. In step 1106, the coarse and fine lock modes of operation are used is disclosed in the copending application entitled "Horizontal Phase-Locked Loop For Video Decoder," Ser. No. 09/126,630, filed on Jul. 30, 1998, which is incorporated by reference herein. In this mode of operation, coarse lock is used to make coarse adjustments to the horizontal DTO to bring the video decoder into fine lock. Once it achieves fine lock, the demmer window is used to maintain fine lock.

In FIG. 12, during the noisy signal mode a flag is always set to indicate the noisy signal mode as shown in step 1204. In logical block 1206, it is determined whether the frame count is zero. If the frame count is equal to zero, in step 1210 a noisy signal threshold is set to a value which is used to enable the tuning algorithm and it is determined whether the average frame flat window sum is less than the noisy signal threshold. The average frame flat window sum serves as a measure of the locked condition. If the average frame flat window sum is less than the noisy signal threshold, the use of flat window is disabled, the use of demmer window is enabled, and the noisy signal threshold is reset to a first threshold value as indicated in step 1212. These conditions indicate that lock is maintained and, therefore, a branch is made to the fine lock processing as shown in step 1218. But if it is not less than the noisy signal threshold, step 1214 enables the use of the flat window algorithm, the frame count is set to 10 and the noisy signal threshold is set to a second smaller threshold value so that the optimum tuning point can be found. These conditions indicate that lock has been lost and, thereby, a switch is made to flat window and the tuning algorithm is enabled. The frame count variable is used to enable the tuning algorithm to run every 10 frames such that enough time is allowed for the newly adjusted the flat normalization constant to take effect. Thus, the frame counter allows the adjustment to occur every 10 frames. Accordingly, in step 1216 the flat window normalization constant is tuned to achieve lock. Finally, in step 1218 fine lock is achieved. Once the tuning algorithm has achieved lock then demmer window is used and the noisy threshold is set back to a higher value.

Figure 13:
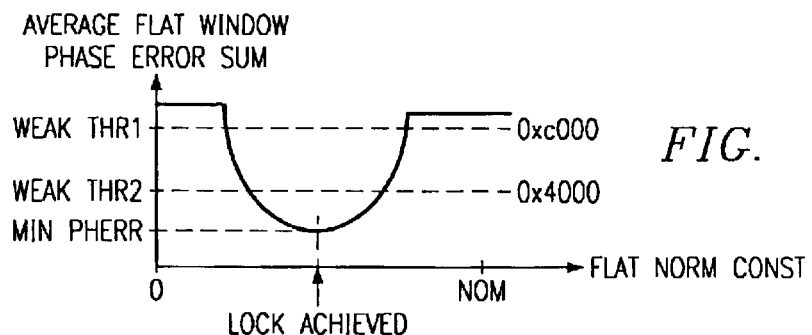
FIG. 13 displays the flat window phase error characteristic.

FIG. 13 illustrates the average flat window phase error sum characteristic. This sum is a running average of the frame sum of the flat window phase error. As shown in FIG. 13, it is necessary to find the point where phase error sum characteristic is a minimum value. This indicates that lock has been achieved. The noisy thresholds, weak_thr1 and weak_thr2, represent the first and second threshold that were made reference of in FIG. 12. In operation, a tuning process must adjust the flat window normalization constant in order to achieve lock. A smoothing filter is used to filter the frame sum of the absolute value of the flat window phase error, where the filter output is the average flat window phase error. According to the given equation below, the filter combines $\frac{1}{16}$ of the frame sum with $\frac{15}{16}$ of the previous phase error:

$$\text{average flat window phase error } \phi_{err} \text{ sum} = \qquad [2]$$
$$\frac{1}{16}(\text{frame flat } \phi_{err} \text{ sum}) + \frac{15}{16}(\text{average flat window } \phi_{err} \text{ sum})$$

Figure 14:
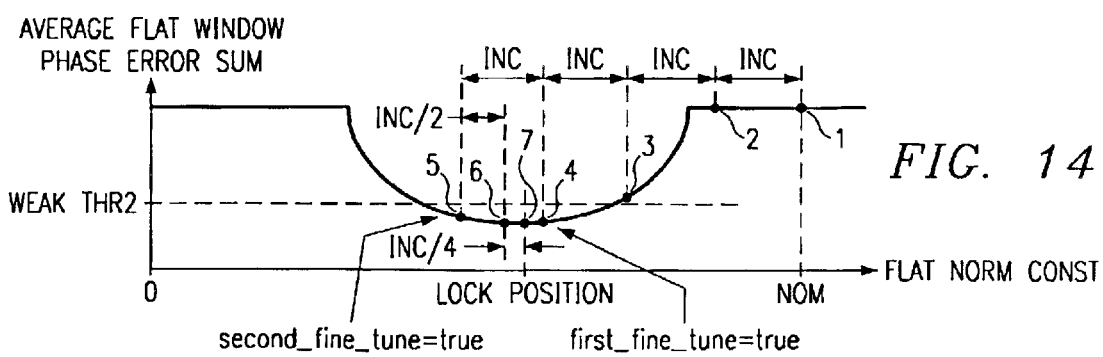
FIG. 14 illustrates the bisection technique of determining the lock position.

The tuning process assumes that the phase error has a characteristic that has a minimum at the lock position as shown in FIGS. 13 and 14. The process uses a bisection technique to vary the flat window normalization constant until the minimum phase error at the lock position is found.

FIG. 14 illustrates an example of a bisection technique that the tuning process may incorporate. The algorithm initializes flat window normalization constant to a nominal value and an increment value to an initial value. The increment is applied on each pass until the phase error drops below the second noisy threshold, weak_thr2. A pass consists of 10 frames such that enough time is allowed to apply the normalization constant and sample its effect. Once below the threshold Boolean flags identify the first and second passes made by the algorithm. During the first pass the phase error is saved as the previous phase error $\phi_{err}$ (prev_pherr), the flat window normalization constant is decremented by the increment (INC) value, and a Boolean flag is set to true which identifies completion of the first pass. During the second pass, the current phase error $\phi_{err}$ (curr_pherr) is compared with the previous phase error $\phi_{err}$ (prev_pherr). A decision is made whether or not to negate the increment. Completion of the second pass is identified by a second fine tune value which is set to true. In successive passes, the current phase error $\phi_{err}$ (curr_pherr) is compared with the previous phase error $\phi_{err}$ (prev_pherr). The increment value is multiplied by a half until the flat window normalization constant increment becomes small (0×040) and the minimum phase error $\phi_{err}$ (min_pherr) is found. Specifically, FIG. 14 shows 7 passes with the increment value (INC) being reduced to one fourth of its original value. The method starts with an initial increment of 0×200 which is reduced to 0×100, 0×080, and 0×040.

In operation, the bisection technique of FIG. 14 bisects the increment value and searches for the minimum value. Given the current phase error is less than the threshold, it must be determined whether the first pass tuning has occurred.

Figure 15:
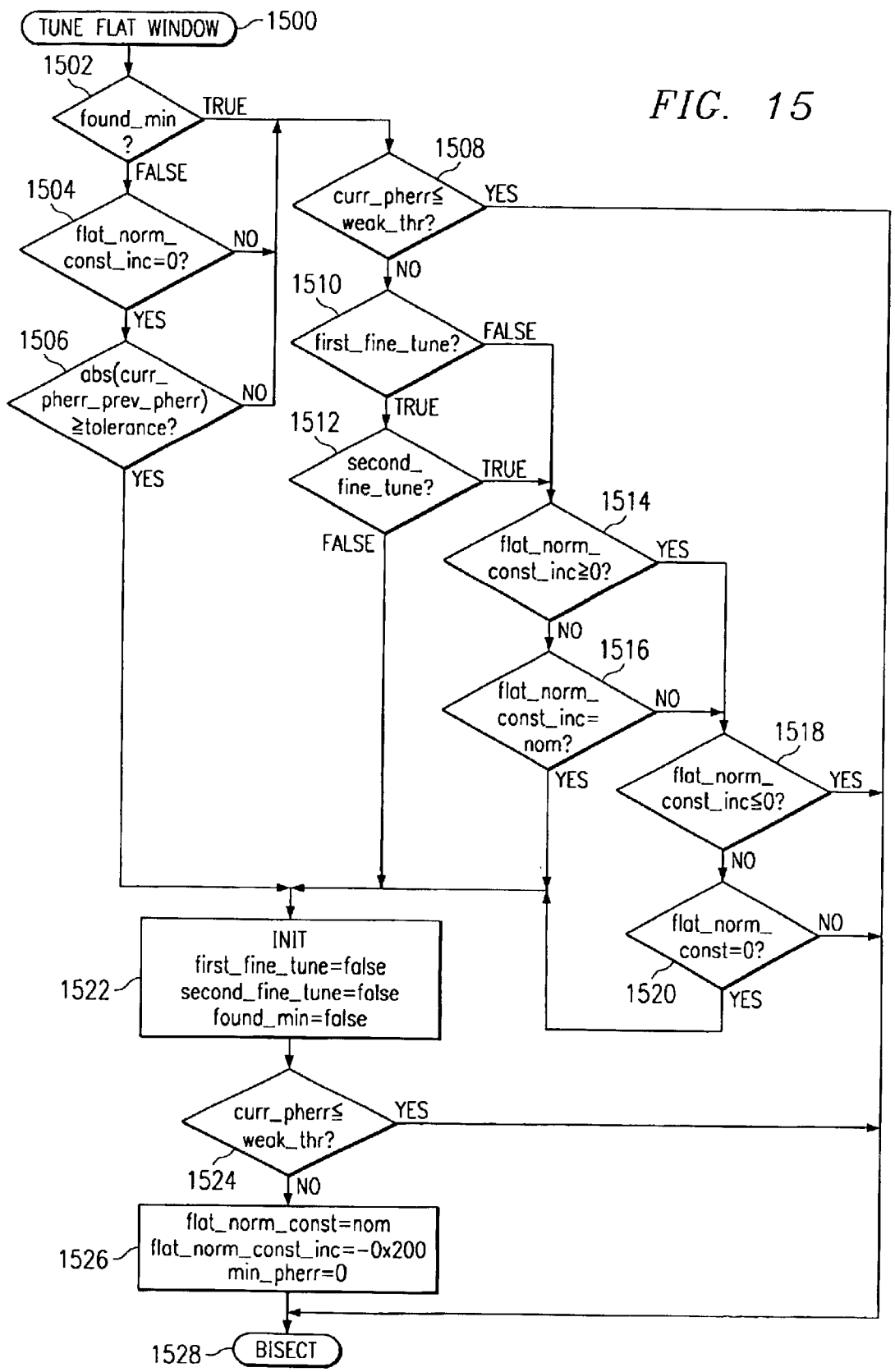
FIG. 15 illustrates a flow chart showing the steps of tuning the signal.

FIG. 15 displays the process flow chart for the initialization section of the tuning process which serves to reinitialize when lock is lost. The lock condition is indicated by the comparison of the current phase error $\phi_{err}$ (curr_pherr) with the second noisy threshold (weak_thr2).

The algorithm will reinitialize itself when three conditions listed below are met. First, the phase error minimum has not been found, the flat window normalization constant equals zero, and the absolute value of the difference between the current and previous phase errors is greater than a tolerance value of 0×1FF. Second, the first pass tuning has been completed while the second pass tuning has not been completed and the current phase error $\phi_{err}$ (curr_pherr) is greater than the second noisy threshold (weak_thr2) which is an indication that the tuning is in the wrong direction. Thirdly, the range limits of flat window normalization constant have been reached, where (a) the flat window normalization constant increment is greater than zero and flat window normalization constant is at the nominal value and (b) the flat window normalization constant increment is negative and flat window normalization constant is zero.

As shown, steps 1502, 1504, and 1506 test for the first condition. In step 1502 a determination is made as to whether the minimum is found. If the found minimum, in step 1504, a determination is made as to whether the flat normalization constant is equal to zero. If it is not step 1508 is executed. If it is, then in step 1506 it is determined whether the absolute value of the current phase error subtracting the previous phase error value is greater than or equal to the tolerance threshold value 0×1FF which represents a lost condition for the algorithm. If it is, then step 1522 is executed as described below. If it is not, then step 1508 is executed as shown and explained above.

As displayed, steps 1508, 1510 and 1512 test for the second condition. If the minimum has been found, it is determined in step 1508 whether the current phase error is less than or equal to the noisy signal threshold. If it is, the process moves to the bisection technique which is given in FIG. 16 at step 1528. If the current phase error is not less than nor equal to the noisy signal threshold, the determination is made whether this is the first pass of fine tuning as shown in step 1510. If it is, then step 1522 is executed as will be explained. If it is not, then step 1518 is executed as is explained above. If the first pass tuning has occurred, then as shown in step 1512, it is determined whether the second pass of tuning has occurred. If it is true, then step 1514 is executed as explained above. If it is false, then in step 1522 the first fine tune variable, second fine tune variable and the flag for minimum found are initialized.

Steps 1514 and 1516 test for part (a) of the third condition. Given if the first pass of tuning has not been conducted or the second pass has occurred, than the flat window normalization constant increment is compared with zero as indicated by step 1514. If the flat window normalization constant increment is not greater than or equal to zero, then a determination is made to verify whether the flat window normalization constant increment is equal to the nominal value as indicated by step 1516.

Steps 1518 and 1520 test for part (b) of the third condition listed above. If the flat window normalization constant increment is greater than or equal to zero, then as indicated in step 1518, it is determined whether the flat window normalization constant increment is greater than or equal to zero then the bisection process is followed in step 1528. If it is not greater than or equal to zero, then as indicated in step 1520 the flat window normalization constant is compared to zero. If it is not equal to zero, then step 1528 is executed. If it is equal to zero then step 1522 is executed which initializes the first pass tune flag, the second pass tune flag, and the minimum flag. In logic block 1524 it is determined whether the current phase error is less than or equal to the noisy threshold. If it is, then as indicated the process of bisection is begun as indicated in step 1528. If it is not, then as shown in step 1526, the flat window normalization constant is set to the nominal value 0×16BC. The flat window normalization constant increment is set to the −0×200 and the minimum phase error variable is set to zero as displayed in step 1526. The bisection process is then begun is step 1528.

Figure 16:
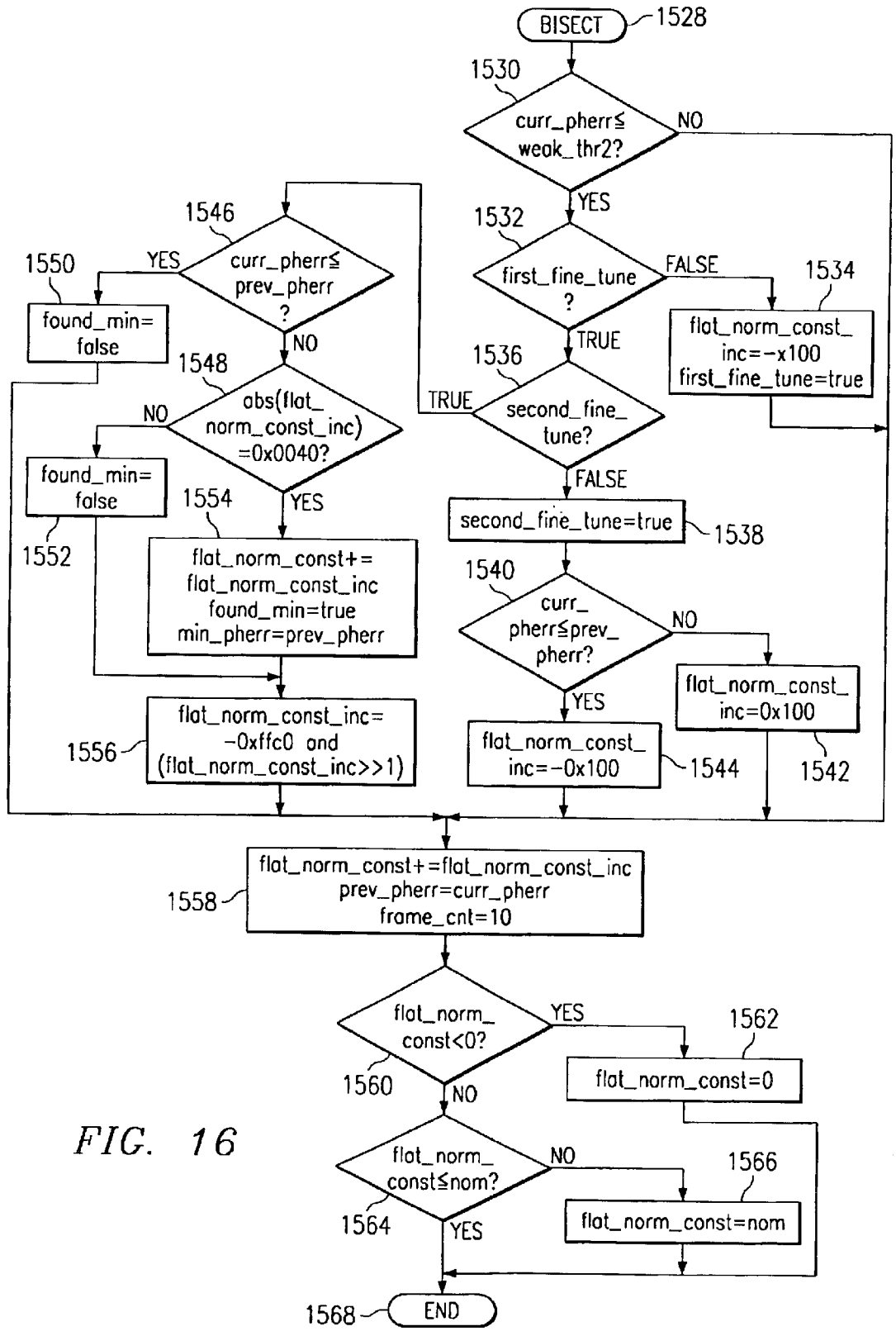
FIG. 16 illustrates a flow chart showing the steps of tuning the signal continued from FIG. 15

FIG. 16 illustrates the actual tuning process which finds the minimum point of the phase error characteristic. In step 1530, the current phase error is the last phase error reading which is compared against the second noisy signal threshold. If it is, in step 1532, the first fine tune is tested to see if it has occurred. If it has not occurred, as indicated by step 1534, the flat normalization constant increment is changed to hexadecimal −0×100 and the flag for the first fine tune is set. Accordingly, in step 1558, the flat normalization constant is incremented by the flat normalization constant increment and the previous phase error is set to the current phase error. The frame count is set to ten, which is indicative of the fact that the tuning is occurring slowly—every ten frames. Thus, the new normalization constant is applied for ten frames and then read. Steps 1560 and 1564 test whether the limits have been reached for the flat nominal constant either zero or the maximum value or nominal value. This keeps the flat normalization constant within these limits of zero and the nominal value.

If the first fine tune has occurred, the in step 1536 it is determined whether a second fine tune has occurred. If it has occurred, then the current phase error and the previous phase error are compared to determine whether is a positive or negative increment that should be applied to the flat normalization constant as indicated in step 1546. This process continues until the minimum point has been found which occurs whenever the absolute value of the flat normalization constant increment is equal to hexadecimal 0×040 as shown in step 1548. If this value is reached, the minimum is found. In step 1554 the flat normalization constant in increased by the flat normalization constant increment variable, the minimum flag is set to true and the minimum phase error is set to the previous phase error. If there is no minimum, the flag is set to false in step 1552. In step 1556, the current increment value is divided by a half by right shifting of one bit.

If the second fine tune has not occurred, step 1538 indicates that a flag is set which stipulates that the second fine tune has occurred. In step 1540, the current phase error is compared with the previous phase error. If the current phase error is less than or equal to the previous phase error, then the flat normalization constant is set to the hexadecimal value of 0×100 as shown in step 1542 and the process proceeds to step 1558 as is described above. If the current phase error is greater than the previous phase error, then the flat normalization constant increment is set to a negative hexadecimal increment of 0×100 and the process proceeds to step 1558 as is described above.

The foregoing described phase-locked loop with a noisy signal input can be implemented on an integrated circuit and used as part of a video decoder chip.

Advantages of this design include but are not limited to a video decoder having a high performance, simple, and cost effective design; wherein the video decoder includes a method of operation that distinguishes between a television and video camera recorder modes of operation, wherein the difference of the horizontal phase error of the top and bottom halves of the picture are made. The demmer window is used which is not sensitive to the sync tip and the back porch levels of the synchronization pulse. Afterwards, the video decoder switches back to the use of the flat window algorithm to regain lock once loss of lock is detected. This video decoder incorporates the use of a bisection technique for tuning the flat window normalization constant.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

We claim:

1. A method of achieving lock in a phase-locked loop comprising:

counting pixels of digital video data, testing for the occurrence of a sync pulse in the digital data and in connection with detecting a sync pulse, performing the following steps:

storing the pixel count value in a register;

comparing the saved pixel count value with a nominal pixel count value;

detecting whether the digital video data represents a video cassette recorder signal or a television signal;

detecting whether noise exists in the digital video data signal when the digital video data represents a television signal;

adjusting, by a coarse amount, an increment value to a discrete time oscillator in connection with the comparison of the saved pixel count value with the nominal pixel count value when the digital video data represents a video cassette recorder signal and a noise-free television signal; and further adjusting, by a fine amount, the increment value in connection with a phase error, whose computation is based on a demmer window weighting function applied to the sync pixels when the digital video data represents a video cassette recorder signal and a noise-free television signal;

adjusting, by a fine amount, the increment value in connection with a phase error, whose computation is based on a flat window weighting function applied to the sync pixels when the digital video data represents a television signal having noise, adjusting by fine amount includes tuning a normalization constant to bring the falling edge of the sync pulse so as to be substantially centered within a flat window of a width corresponding to predetermined number of pixel clock cycles.

2. A method of achieving lock in a phase-locked loop as recited in claim 1 wherein the step of detecting a sync pulse is accomplished by identifying a predetermined number of pixels which are below a threshold value.

3. A method of achieving lock in a phase-locked loop as recited in claim 2 wherein the step of further adjusting by a fine amount includes adjusting the falling edge of the sync pulse so as to be substantially centered within a filter gate window of a width corresponding to predetermined number of pixel clock cycles.

4. A method of achieving lock in a phase-locked loop as recited in claim 3 wherein the window consists of a demmer window.

5. A method as recited in claim 2 wherein the predetermined number of pixels is 15.

6. A method of achieving lock in a phase-locked loop as recited in claim 1, which further includes writing a nominal increment value to the discrete time oscillator in connection with the non-detection of the sync pulse wherein the step of adjusting the increment value by a coarse amount is accomplished by the following steps:

determining whether the sync pulse has been detected;

writing a nominal increment value to the discrete time oscillator in connection with the non-detection of the sync pulse; and determining an increment value within a range of values.

7. A method of achieving lock in a phase-locked loop as recited in claim 6, wherein the range of values is between +40 and −40.

8. A method of achieving lock in a phase-locked loop as recited in claim 1, wherein the step of detecting whether the digital video data is a video cassette recorder signal or a television signal is accomplished by the following steps:

summing the phase error for the top and bottom halves of the frame;

calculating the frame half delta by subtracting the top half sum from the bottom half sum;

determining the minimum sum between the top and bottom half sums;

calculating a threshold variable based upon the minimum half frame sum;

comparing the frame half delta with the threshold variable; and setting a video cassette recorder flag when the frame half delta is greater than and equal to the threshold variable.

9. A method of achieving lock in a phase-locked loop as recited in claim 8, wherein the step of detecting whether noise exists in the television signal is accomplished by the following steps:

calculating a noise threshold by subtracting the frame half delta from a fixed constant;

comparing the minimum half frame sum and the noise threshold; and setting a noisy signal flag when the minimum half frame sum is greater than and equal to the noise threshold.

10. A method as recited in claim 1 which is accomplished by instructions from a microprocessor.

* * * * *